United States Patent
Isaji

(10) Patent No.: US 10,256,437 B2
(45) Date of Patent: Apr. 9, 2019

(54) BARRIER FILM, ORGANIC EL DEVICE, FLEXIBLE SUBSTRATE, AND METHOD FOR MANUFACTURING BARRIER FILM

(71) Applicant: PANASONIC CORPORATION, Osaka (JP)

(72) Inventor: Yuka Isaji, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 15/428,603

(22) Filed: Feb. 9, 2017

(65) Prior Publication Data
US 2017/0155090 A1      Jun. 1, 2017

Related U.S. Application Data

(63) Continuation of application No. 14/768,858, filed as application No. PCT/JP2014/002723 on May 23, 2014, now Pat. No. 9,601,718.

(30) Foreign Application Priority Data

May 24, 2013   (JP) .................................. 2013-109726
Mar. 20, 2014   (JP) .................................. 2014-059002

(51) Int. Cl.
| | | |
|---|---|---|
| *H01L 51/52* | (2006.01) | |
| *C23C 16/34* | (2006.01) | |
| *H01L 51/00* | (2006.01) | |
| *H01L 27/32* | (2006.01) | |
| *H01L 51/56* | (2006.01) | |

(52) U.S. Cl.
CPC ........ *H01L 51/5256* (2013.01); *C23C 16/345* (2013.01); *H01L 27/3258* (2013.01);
(Continued)

(58) Field of Classification Search
CPC ............. H01L 51/5256; H01L 51/0097; H01L 27/3258; H01L 51/56; H01L 2251/5338; H01L 2251/301
See application file for complete search history.

(56) References Cited

U.S. PATENT DOCUMENTS

2004/0247949 A1 * 12/2004 Akedo .................. C23C 16/347
                                                                            428/704
2006/0093795 A1    5/2006 Wang et al.
(Continued)

FOREIGN PATENT DOCUMENTS

| JP | 6-291114 | 10/1994 |
|---|---|---|
| JP | 2004-87253 | 3/2004 |

(Continued)

OTHER PUBLICATIONS

Su B. Jin et al., "Gas barrier properties of SiON films deposited by plasma enhanced chemical vapor deposition at low temperature as a function of the plasma process parameters," Surface & Coatings Technology 228, May 12, 2012, pp. S490-S494.
(Continued)

*Primary Examiner* — Kevin Quarterman
(74) *Attorney, Agent, or Firm* — Greenblum & Bernstein, P.L.C.

(57) ABSTRACT

A barrier film that contains primarily silicon nitride has a total hydrogen concentration of $3 \times 10^{22}$ atoms/cm$^3$ or higher and a silicon-bonded hydrogen concentration proportion of 40% or higher, the total hydrogen concentration indicating a total of a concentration of hydrogen bonded to silicon and a concentration of hydrogen bonded to nitrogen, and the silicon-bonded hydrogen concentration proportion indicating a proportion of the concentration of hydrogen bonded to silicon to the total hydrogen concentration.

14 Claims, 17 Drawing Sheets

(52) U.S. Cl.
CPC ...... *H01L 51/0097* (2013.01); *H01L 51/5253* (2013.01); *H01L 51/56* (2013.01); *H01L 2251/301* (2013.01); *H01L 2251/5338* (2013.01)

(56) References Cited

U.S. PATENT DOCUMENTS

| | | |
|---|---|---|
| 2008/0211066 A1 | 9/2008 | Akedo et al. |
| 2008/0286984 A1 | 11/2008 | Taylor et al. |
| 2009/0166815 A1 | 7/2009 | Makiyama et al. |
| 2009/0309486 A1 | 12/2009 | Imai et al. |
| 2011/0175101 A1 | 7/2011 | Hatano et al. |
| 2011/0262679 A1 | 10/2011 | Azuma et al. |

FOREIGN PATENT DOCUMENTS

| | | |
|---|---|---|
| JP | 2005-339863 | 12/2005 |
| JP | 2007-48982 | 2/2007 |
| JP | 2009-164300 | 7/2009 |
| JP | 2010-211983 A | 9/2010 |
| JP | 2011-171287 | 9/2011 |
| JP | 2011-231357 | 11/2011 |

OTHER PUBLICATIONS

European Extended Search Report for counterpart application No. EP14801311.3, dated Jun. 13, 2016.
International Search Report for related Application No. PCT/JP2014/002723, dated Aug. 12, 2014 (with English-language translation).

* cited by examiner

FIG. 2

| Sample | Hydrogen concentration [atoms/cm³] | | | Water vapor transmission rate [g/m²/day] |
|---|---|---|---|---|
| | Total | Si-H | Si-H/Total [%] | |
| 1 | $2.02 \times 10^{22}$ | $1.00 \times 10^{22}$ | 49.6 | $1.3 \times 10^{-3}$ |
| 2 | $3.31 \times 10^{22}$ | $2.42 \times 10^{22}$ | 73.2 | $5.6 \times 10^{-4}$ |
| 3 | $2.97 \times 10^{22}$ | $2.05 \times 10^{22}$ | 69.0 | $3.5 \times 10^{-4}$ |
| 4 | $2.97 \times 10^{22}$ | $1.69 \times 10^{22}$ | 57.0 | $1.5 \times 10^{-3}$ |
| 5 | $3.48 \times 10^{22}$ | $1.00 \times 10^{22}$ | 28.7 | $3.5 \times 10^{-2}$ |
| 6 | $3.91 \times 10^{22}$ | $7.22 \times 10^{21}$ | 18.5 | $7.5 \times 10^{-3}$ |
| 7 | $3.72 \times 10^{22}$ | $1.87 \times 10^{22}$ | 50.3 | $2.5 \times 10^{-3}$ |
| 8 | $2.56 \times 10^{22}$ | $6.08 \times 10^{21}$ | 23.8 | $1.0 \times 10^{-2}$ |
| 9 | $2.92 \times 10^{22}$ | $8.23 \times 10^{21}$ | 28.2 | $1.0 \times 10^{-2}$ |

FIG. 5

| Sample | | 3 | 4 |
|---|---|---|---|
| Hydrogen concentration [atoms/cm$^3$] | Total | $2.97 \times 10^{22}$ | $2.97 \times 10^{22}$ |
| | Si-H | $2.05 \times 10^{22}$ | $1.69 \times 10^{22}$ |
| | N-H | $9.20 \times 10^{21}$ | $1.28 \times 10^{22}$ |
| Hydrogen concentration proportion [%] | Si-H/Total | 69.0 | 57.0 |
| | N-H/Total | 31.0 | 43.0 |
| Film density [g/cm$^3$] | | 2.32 | 2.07 |

FIG. 6A
| Total hydrogen concentration [atoms/cm³] | $2.02 \times 10^{22}$ | $2.97 \times 10^{22}$ | $3.18 \times 10^{22}$ | $3.31 \times 10^{22}$ | $3.48 \times 10^{22}$ | $3.72 \times 10^{22}$ |
|---|---|---|---|---|---|---|
| Cracks occurring when R = 5 mm | × | × | ○ | ○ | ○ | ○ |
FIG. 6B
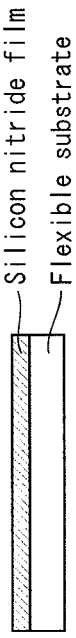
FIG. 6C
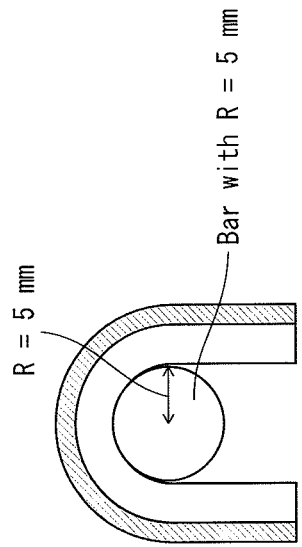

FIG. 7

| Sample | | 11 | 12 |
|---|---|---|---|
| Film formation temperature [°C] | | 300 | 180 |
| Hydrogen concentration [atoms/cm$^3$] | Total | $2.5 \times 10^{22}$ | $3.2 \times 10^{22}$ |
| | Si-H | $0.6 \times 10^{22}$ | $1.1 \times 10^{22}$ |
| | N-H | $1.9 \times 10^{22}$ | $2.1 \times 10^{22}$ |
| Hydrogen concentration proportion [%] | Si-H/Total | 24 | 34 |
| | N-H/Total | 76 | 66 |
| Film density [g/cm$^3$] | | 2.37 | 2.04 |

FIG. 8

| | Before process | After heating at 230°C | After UV radiation |
|---|---|---|---|
| Water vapor transmission rate [g/m$^2$/day] | $2 \times 10^{-4}$ | $4 \times 10^{-4}$ | $1 \times 10^{-3}$ |

Measurement environment : 60°C/90%RH

400

500

600

BARRIER FILM, ORGANIC EL DEVICE, FLEXIBLE SUBSTRATE, AND METHOD FOR MANUFACTURING BARRIER FILM

CROSS REFERENCE TO RELATED APPLICATIONS

The present application is a continuation application of U.S. application Ser. No. 14/768,858 filed on Aug. 19, 2015, which is a U.S. National Stage of International Application No. PCT/JP2014/002723 filed on May 23, 2014, the disclosures of which are expressly incorporated by reference herein in their entirety.

TECHNICAL FIELD

The present invention relates to a barrier film that contains primarily silicon nitride (hereinafter, referred to as a silicon nitride film).

BACKGROUND ART

A silicon nitride film is excellent in terms of not only gas barrier properties but also transparency, and accordingly is widely utilized as a barrier film in the food, medical, and electronics fields. Non-Patent Literature 1 proposes that gas barrier properties of a barrier film are improved by decreasing impurity concentration of the barrier film. Also, Patent Literature 1 proposes that gas barrier properties of a silicon nitride film are improved by decreasing oxygen concentration of the silicon nitride film (paragraph 0018).

CITATION LIST

Patent Literature

[Patent Literature 1] Japanese Patent Application Publication No. 2011-231357

Non-Patent Literature

[Non-Patent Literature 1] S. B. Jin et al., Surface & Coatings Technology (2012)

SUMMARY OF INVENTION

Technical Problem

In the field of electronics (for example, organic EL devices), there is a case where material is used that tends to deteriorate by reaction with oxygen and water vapor. Accordingly, high gas barrier properties are especially required. Of course in the food and medical fields, the gas barrier properties should desirably be high rather than low. Generally, a high density film having a small amount of impurities incorporated therein is considered to be appropriate in order to improve the gas barrier properties. However, since such a high density film is subject to impact and bending, cracks easily occur in the high density film. As a result of researches proceeded to improve the gas barrier properties and the crack resistance of the silicon nitride film, the inventor got novel findings on factors that affect the gas barrier properties of the silicon nitride film. One of the aims of the present disclosure is to provide a silicon nitride film having excellent gas barrier properties and crack resistance based on the novel findings.

Solution to Problem

A barrier film relating to one aspect of the present disclosure is a barrier film that contains primarily silicon nitride, wherein a total hydrogen concentration is $3\times10^{22}$ atoms/cm$^3$ or higher, the total hydrogen concentration indicating a total of a concentration of hydrogen bonded to silicon and a concentration of hydrogen bonded to nitrogen, and a silicon-bonded hydrogen concentration proportion is 40% or higher, the silicon-bonded hydrogen concentration proportion indicating a proportion of the concentration of hydrogen bonded to silicon to the total hydrogen concentration.

Advantageous Effects of Invention

With the above configuration, it is possible to obtain a silicon nitride film having excellent gas barrier properties and crack resistance.

BRIEF DESCRIPTION OF DRAWINGS

FIG. 2 shows measurement results of the total hydrogen concentration, Si—H hydrogen concentration, Si—H hydrogen concentration proportion, and the water vapor transmission rate of the silicon nitride films.

FIG. 5 shows measurement results of the Si—H hydrogen concentration proportion and film density of the silicon nitride films.

FIG. 6A shows total hydrogen concentration of silicon nitride films and measurement results as to whether cracks occur in the case where each of the silicon nitride films that is formed on a flexible substrate is bent at R=5 mm, FIG. 6B shows a sample of the silicon nitride film formed on the flexible substrate, and FIG. 6C shows a measurement situation.

FIG. 7 shows film formation temperature and measurement results of film density of silicon nitride films.

FIG. 8 shows results of a weather resistance test of silicon nitride films.

FIG. 10A shows a sample formed under conditions of a film formation method of CCP-CVD and a substrate temperature of 380 degrees C., FIG. 10B shows a sample formed under conditions of a film formation method of CCP-CVD and a substrate temperature of 180 degrees C., and FIG. 10C shows a sample formed under conditions of a film formation method of SWP-CVD and a substrate temperature equal to a room temperature.

DESCRIPTION OF EMBODIMENTS

Process by which the Aspects of the Present Disclosure were Achieved

A silicon nitride film is formed by thermal chemical vapor deposition (CVD), Cat-CVD, surface wave plasma (SWP) CVD, or the like. According to the thermal CVD, since a silicon nitride film is formed in a high-temperature environment, precursor of silicon nitride ($SiH_x$ generated from $SiH_4$ as source gas and $NH_x$ generated from $NH_3$ as source gas), which is deposited on a surface of the silicon nitride film being formed, tends to move to an appropriate position. This increases film density of the silicon nitride film, and thus improves the gas barrier properties of the silicon nitride film. Also, formation of the silicon nitride film in a high-temperature environment results in easy cut-off of bonding between silicon and hydrogen (hereinafter, referred to as Si—H) and bonding between nitrogen and hydrogen (hereinafter, referred to as N—H) and thereby decrease in concentration of hydrogen remaining in the silicon nitride film. On the other hand, in the case where a silicon nitride film is formed in a low-temperature environment, precursor of silicon nitride, which is deposited on a surface of the silicon nitride film being formed, is difficult to move to an appropriate position. This decreases the film density of the silicon nitride film, and thus decreases the gas barrier properties of the silicon nitride film. Also, formation of the silicon nitride film in the low-temperature environment results in difficult cut-off of Si—H and N—H and thereby increase in concentration of hydrogen remaining in the silicon nitride film (for example, see Patent Literature 1, paragraphs 0016-0018).

Figure 1:
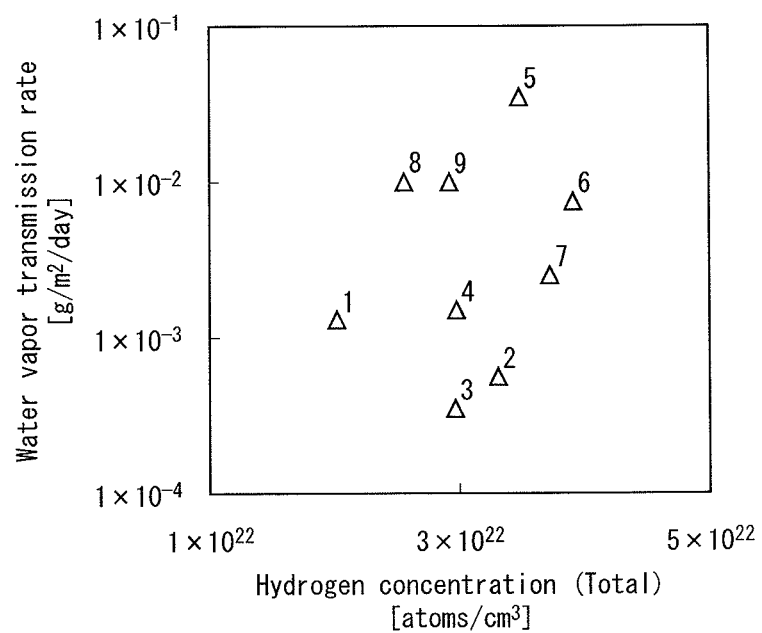
FIG. 1 shows measurement results of total hydrogen concentration and water vapor transmission rate of silicon nitride films.

According to the above conventional findings, it is considered that a correlation exists between the hydrogen concentration and the gas barrier properties of the silicon nitride film. In order to study this, the inventor manufactured nine types of samples that are different in hydrogen concentration from each other, and measured water vapor transmission rate of the samples. FIG. 1 shows measurement results of hydrogen concentration and water vapor transmission rate of the samples. The water vapor transmission rate is a parameter indicating the gas barrier properties of the silicon nitride film. Lower water vapor transmission rate indicates higher gas barrier properties of the silicon nitride film.

According to the figure, however, no significant correlation exists between the total hydrogen concentration (Total) and the water vapor transmission rate. In other words, contrary to the conventional findings, the measurement results show that there is no correlation between the hydrogen concentration and the water vapor transmission rate of the silicon nitride film. In view of this, the inventor assumed that any factors other than the total hydrogen concentration affect the gas barrier properties of the silicon nitride film, and made earnest consideration. As a result, the inventor found that a close correlation exists between a proportion of Si—H hydrogen concentration to the total of Si—H hydrogen concentration and N—H hydrogen concentration of a silicon nitride film and the gas barrier properties. The silicon nitride film relating to one aspect of the present disclosure was obtained based on the novel findings.

One Aspect of the Present Disclosure

A barrier film relating to one aspect of the present disclosure contains primarily silicon nitride, wherein a total hydrogen concentration is $3 \times 10^{22}$ atoms/cm$^3$ or higher, the total hydrogen concentration indicating a total of a concentration of hydrogen bonded to silicon and a concentration of hydrogen bonded to nitrogen, and a silicon-bonded hydrogen concentration proportion is 40% or higher, the silicon-bonded hydrogen concentration proportion indicating a proportion of the concentration of hydrogen bonded to silicon to the total hydrogen concentration. With this configuration, it is possible to exhibit excellent gas barrier properties and crack resistance.

In the barrier film, the silicon-bonded hydrogen concentration proportion may be 60% or higher. With this configuration, it is possible to exhibit further excellent gas barrier properties.

In the barrier film, a nitrogen-bonded hydrogen concentration proportion may be 45% or lower, the nitrogen-bonded hydrogen concentration proportion indicating a proportion of the concentration of hydrogen bonded to nitrogen to the total hydrogen concentration. With this configuration, it is possible to exhibit an excellent weather resistance.

In the barrier film, a nitrogen-bonded hydrogen concentration proportion may be 30% or lower. With this configuration, it is possible to exhibit a further excellent weather resistance.

An organic EL device relating to one aspect of the present disclosure comprises: a first barrier film; a second barrier film; an organic EL element that is disposed between the first barrier film and the second barrier film. At least one of the first barrier film and the second barrier film contains primarily silicon nitride, has a total hydrogen concentration of $3 \times 10^{22}$ atoms/cm$^3$ or higher and a silicon-bonded hydrogen concentration proportion of 40% or higher. With this configuration, it is possible to exhibit excellent gas barrier properties and crack resistance.

The organic EL device may further comprise: a first flexible substrate that is disposed opposite the organic EL element with the first barrier film interposed therebetween; a second flexible substrate that is disposed opposite the organic EL element with the second barrier film interposed therebetween; and a third barrier film that is disposed between the second barrier film and the organic EL element, and contains primarily silicon nitride, wherein the first barrier film and the second barrier film may each have a higher silicon-bonded hydrogen concentration proportion than the third barrier film has. The first barrier film and the second barrier film are located in positions where water more easily intrudes from outside than the third barrier film is. It is possible to prolong the operating life of the organic EL device by improving the gas barrier properties of the barrier films which are located in positions where water more easily intrudes from outside.

The organic EL device may further comprise: a first flexible substrate that is disposed opposite the organic EL element with the first barrier film interposed therebetween; a second flexible substrate that is disposed opposite the organic EL element with the second barrier film interposed therebetween; and a third barrier film that is disposed between the second barrier film and the organic EL element, and contains primarily silicon nitride, wherein the first barrier film and the second barrier film may each have a total hydrogen concentration than the third barrier film has. When the organic EL device is warped, the first barrier film and the second barrier film each have a higher bending property than the third barrier film has. It is possible to prolong the operating life of the organic EL device by improving the crack resistance of the barrier films which have a higher bending property when the organic EL device is warped.

The organic EL device may further comprise: a first flexible substrate that is disposed opposite the organic EL element with the first barrier film interposed therebetween; a second flexible substrate that is disposed opposite the organic EL element with the second barrier film interposed therebetween; and a third barrier film that is disposed between the second barrier film and the organic EL element, and contains primarily silicon nitride, wherein, light emitted from the organic EL element may be extracted externally through the first flexible substrate, the first barrier film may have a lower nitrogen-bonded hydrogen concentration proportion than the third barrier film has, and the third barrier film may have a lower nitrogen-bonded hydrogen concentration proportion than the second barrier film has. In this case, the first barrier film is located in a position where external light is incident more easily than the third barrier film is. Also, the third barrier film is located in a position where external light is incident more easily than the second barrier film is. It is possible to prolong the operating life of the organic EL device by improving the weather resistance of the barrier film which is located in a position where external light is easily incident. Alternatively, the light emitted from the organic EL element may be extracted externally through the second flexible substrate, the second barrier film may have a lower nitrogen-bonded hydrogen concentration proportion than the third barrier film has, and the third barrier film may have a lower nitrogen-bonded hydrogen concentration proportion than the first barrier film has. In this case, the second barrier film is located in a position where external light is incident more easily than the third barrier film is. Also, the third barrier film is located in a position where external light is incident more easily than the first barrier film is. It is possible to prolong the operating life of the organic EL device by improving the weather resistance of the barrier film which is located in a position where external light is more easily incident.

The organic EL device may further comprise a thin-film transistor that is disposed between the first barrier film and the organic EL element, is electrically connected with the organic EL element, and includes an oxide semiconductor layer, wherein the first barrier film may have a lower total hydrogen concentration than the second barrier film has. Introduction of hydrogen into the oxide semiconductor layer deteriorates electrical properties of the oxide semiconductor layer. This causes for example a failure in threshold shift in the thin-film transistor including the oxide semiconductor layer. The first barrier film is located in a position closer to the oxide semiconductor layer than the second barrier film is. It is possible to reduce a possibility of introduction of hydrogen into the oxide semiconductor layer by decreasing the total hydrogen concentration of the barrier film which is located in a position closer to the oxide semiconductor layer.

The organic EL device may further comprise a third barrier film that is disposed between the thin-film transistor and the organic EL element, and contains primarily silicon nitride, wherein the third barrier film may have a lower total hydrogen concentration than the second barrier film has. The third barrier film is located in a position closer to the oxide semiconductor layer than the second barrier film is. It is possible to reduce a possibility of introduction of hydrogen into the oxide semiconductor layer by decreasing the total hydrogen concentration of the barrier film which is located in a position closer to the oxide semiconductor layer.

A flexible substrate relating to one aspect of the present disclosure includes a flexible substrate and a barrier film disposed on the flexible substrate, wherein the barrier film contains primarily silicon nitride, and has a silicon-bonded hydrogen concentration proportion of 40% or higher. With this configuration, it is possible to exhibit excellent gas barrier properties.

In the flexible substrate, the silicon-bonded hydrogen concentration proportion may be 60% or higher. With this configuration, it is possible to exhibit further excellent gas barrier properties.

In the flexible substrate, the total hydrogen concentration may be $3 \times 10^{22}$ atoms/cm$^3$ or higher. With this configuration, it is possible to exhibit an excellent crack resistance.

A method of manufacturing a barrier film relating to one aspect of the present disclosure is a method of manufacturing a barrier film that contains primarily silicon nitride by chemical vapor deposition with use of surface wave plasma, the method comprising the step of setting a proportion of a flow rate of ammonia to a flow rate of silane to 1.0 or higher and 2.0 or lower. With this configuration, it is possible to obtain a barrier film having the silicon-bonded hydrogen concentration proportion of 40% or higher, that is, a barrier film having excellent gas barrier properties.

The method may further comprise the step of maintaining a temperature of a flexible substrate on which the barrier film is to be formed to 120 degrees C. or lower. With this configuration, it is possible to suppress deterioration of the flexible substrate due to heat.

A barrier film relating to one aspect of the present disclosure is a barrier film that contains primarily silicon nitride and has a silicon-bonded hydrogen concentration proportion of 40% or higher. With this configuration, it is possible to exhibit further excellent gas barrier properties.

In the barrier film, the silicon-bonded hydrogen concentration proportion may be 60% or higher. With this configuration, it is possible to exhibit further excellent gas barrier properties.

Definition of Terms

In the present Description, the following terms are defined. Concentration of hydrogen bonded to silicon of a silicon nitride film is referred to as Si—H hydrogen concentration. Concentration of hydrogen bonded to nitrogen of the silicon nitride film is referred to as N—H hydrogen concentration. The total of the Si—H hydrogen concentration and the N—H hydrogen concentration of the silicon nitride film is referred to as total hydrogen concentration. A proportion of the Si—H hydrogen concentration to the total hydrogen concentration is referred to as Si—H hydrogen concentration proportion. A proportion of the N—H hydrogen concentration to the total hydrogen concentration is referred to as N—H hydrogen concentration proportion.

Embodiment 1

Figure 3:
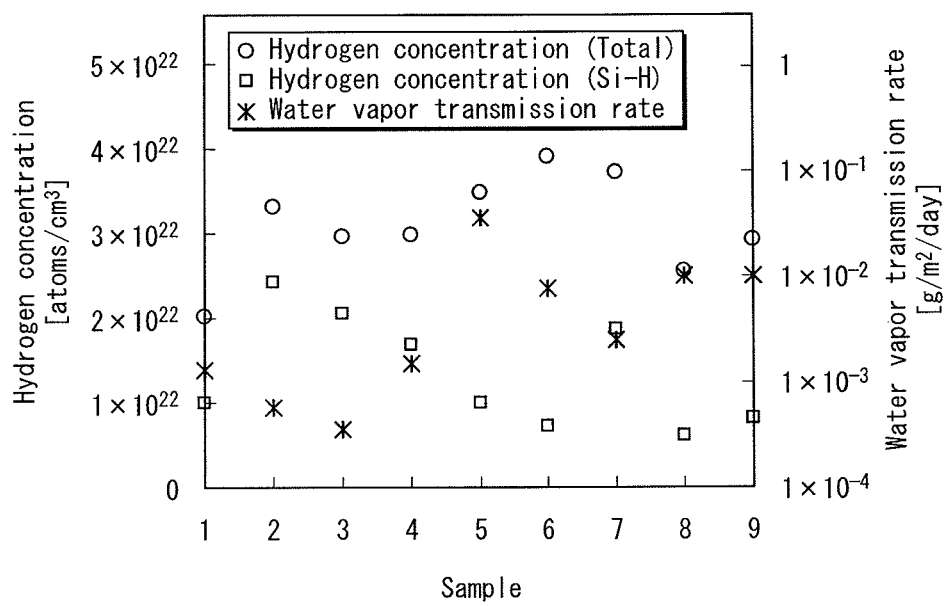
FIG. 3 shows measurement results of the total hydrogen concentration, the Si—H hydrogen concentration, and the water vapor transmission rate of the silicon nitride films.

FIG. 2 and FIG. 3 show measurement results of the hydrogen concentration and the water vapor transmission rate of nine types of samples that are different in hydrogen concentration from each other.

The samples were manufactured by SWP-CVD with use of silane ($SiH_4$) and ammonia ($NH_3$) as source gas. The hydrogen concentration of each of the samples is arbitrarily varied by varying power supplied to an SWP-CVD apparatus, flow rate of $SiH_4$, and flow rate of $NH_3$. For example, a tendency was observed that as the supplied power increases, the total hydrogen concentration decreases, the Si—H hydrogen concentration decreases, and the N—H hydrogen concentration increases. Also, a tendency was observed that the flow rate of $SiH_4$ increases, the Si—H hydrogen concentration increases and the N—H hydrogen concentration decreases. Furthermore, a tendency was observed that the flow rate of $NH_3$ increases, the Si—H hydrogen concentration decreases and the N—H hydrogen concentration increases.

The Si—H hydrogen concentration and the N—H hydrogen concentration were measured by the fourier transform infrared (FT-IR) spectroscopy. According to the FT-IR spectroscopy, the Si—H hydrogen concentration and the N—H hydrogen concentration are separately measured. The total of the Si—H hydrogen concentration and the N—H hydrogen concentration was set to the total hydrogen concentration (Total). A silicon nitride film of 400 nm to 500 nm on a silicon substrate was used as each of the samples.

The water vapor transmission rate was measured by a calcium corrosion method. A silicon nitride film of 500 nm formed on a flexible substrate was used as each of the samples. An experiment environment of temperature of 60 degrees C. and humidity of 90% RH was set. All the values of water vapor transmission rate in the present Description are values measured at temperature of 60 degrees C. and humidity of 90% RH. Note that values measured at temperature of 60 degrees C. and humidity of 90% RH are calculated to be equivalent to 20 times values measured at temperature of 25 degrees C. and humidity of 50% RH, based on the conventional findings.

Referring to FIG. 3, no significant correlation exists between the total hydrogen concentration and the water vapor transmission rate. For example, the sample 3 and 4 are substantially equal to each other in total hydrogen concentration, but greatly differ from each other in water vapor transmission rate. Also, no significant correlation exists between the Si—H hydrogen concentration and the water vapor transmission rate. For example, the sample 1 and 5 are substantially equal to each other in Si—H hydrogen concentration, but greatly differ from each other in water vapor transmission rate. The measurement results demonstrate that no significant correlation exists either between the total hydrogen concentration and the water vapor transmission rate or between the Si—H hydrogen concentration and the water vapor transmission rate.

Figure 4:
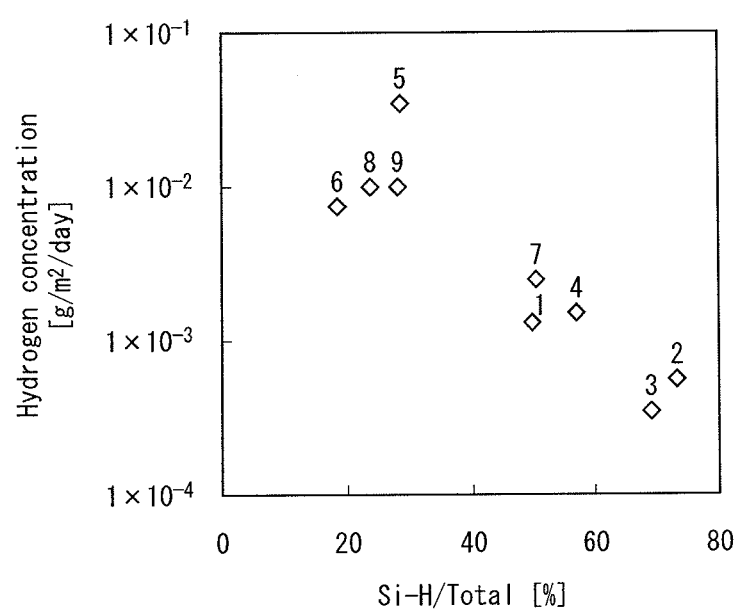
FIG. 4 shows measurement results of the Si—H hydrogen concentration proportion and the water vapor transmission rate of the silicon nitride films.

On the other hand, a significant correlation exists between the Si—H hydrogen concentration proportion and the water vapor transmission rate. FIG. 4 shows measurement results of the Si—H hydrogen concentration proportion and the water vapor transmission rate of the samples. Referring to the figure, it is observed that as the Si—H hydrogen concentration proportion increases, the water vapor transmission rate decreases. This demonstrates that the gas barrier properties of the silicon nitride film depends on not the total hydrogen concentration but the Si—H hydrogen concentration proportion of the silicon nitride film.

With respect to the samples 5, 6, 8, and 9, it was difficult to measure the water vapor transmission rate with a sufficient accuracy due to a high corrosion speed of calcium. A silicon nitride film such as the samples 5, 6, 8, and 9 is not practical as a barrier film. With respect to the sample 1, 4, and 7 compared with this, it was possible to measure the water vapor transmission rate with a sufficient accuracy. A silicon nitride film having at least the same level of water vapor transmission rate as the samples 1, 4, and 7 is practical as a barrier film. Therefore, the silicon nitride film should preferably have a Si—H hydrogen concentration proportion of 40% or higher. Furthermore, with respect to the samples 2 and 3, the water vapor transmission rate decreased to close to 2E-04 $g/m^2$/day that is the measurement limit in the calcium corrosion method. Therefore, the silicon nitride film should more preferably have a Si—H hydrogen concentration proportion of 60% or higher.

The following shows a relation between Si—H hydrogen concentration proportion, N—H hydrogen concentration proportion, and film density. As shown in FIG. 5, comparison of the samples 3 and 4 demonstrates that in the case where the total hydrogen concentration is the same, as the Si—H hydrogen concentration proportion increases (as the N—H hydrogen concentration decreases), the film density increases. Reason for this is inferred as follows.

While silicon has four bonds, nitrogen has three bonds. In silicon, in the case where one of the bonds is bonded to hydrogen, other three of the bonds contribute to bonding to adjacent atoms (silicon or nitrogen). In nitrogen, on the other hand, in the case where one of the bonds is bonded to hydrogen, other two of the bonds contribute to bonding to adjacent atoms (silicon or nitrogen). It is considered that as the number of bonds that contribute to bonding to adjacent atoms increases, the film density increases. For this reason, in the case where the total hydrogen concentration is the same, the Si—H hydrogen concentration proportion increases, the film density increases.

Hydrogen remaining in the silicon nitride film decreases film density due to disturbance of an ideal structure of $Si_3N_4$. This deteriorates the gas barrier properties. According to the new findings of the inventor, however, in the case where the hydrogen remaining in the silicon nitride film is the same, it is possible to suppress decrease of the film density by increasing the Si—H hydrogen concentration proportion of the silicon nitride film. This ensures excellent gas barrier properties.

Note that film formation conditions for the samples are as shown below. Plasma was generated stably by setting pressure in a reactor to 10 Pa and supplied power to 0.75 kW to 1.2 kW. Furthermore, a proportion of the flow rate of $NH_3$ to the flow rate of $SiH_4$ was set to fall within a range of 1.0 to 2.0. As a result, the samples with a Si—H hydrogen concentration proportion of 40% or higher were obtained.

Also, another experiment performed by the inventor demonstrates that the same effect as the above is achieved by a sample of a silicon nitride film having thickness of 250 nm. It is generally considered that as the thickness of the silicon nitride film increases, the gas barrier properties improves. Therefore, in the case where a silicon nitride film having thickness of 250 nm or more has a Si—H hydrogen concentration proportion of 40% or higher, sufficient gas barrier properties are ensured.

As clear from the above, it is possible to obtain a silicon nitride film with excellent gas barrier properties by setting a Si—H hydrogen concentration proportion of the silicon nitride film to 40% or higher.

Also, the Si—H hydrogen concentration proportion is adjustable by varying the power supplied to the SWP-CVD apparatus, the flow rate of $SiH_4$, and the flow rate of $NH_3$. Since the SWP-CVD allows formation of a silicon nitride film in a low-temperature environment, various types of flexible substrates are utilizable for a foundation of the silicon nitride film. This is convenient to obtain a flexible substrate including a flexible substrate and a barrier film. It is possible to suppress deterioration of the flexible substrate particularly by setting a substrate temperature to 120 degrees C. or lower.

FIG. 6A shows total hydrogen concentration of silicon nitride films and measurement results as to whether cracks occur in the case where each of the silicon nitride films that is formed on a flexible substrate is bent at a radius of approximately 5 mm (R=5 mm). FIG. 6B shows a sample of the silicon nitride film formed on the flexible substrate. FIG. 6C shows a measurement situation.

The measurement results demonstrate that in the case where a silicon nitride film has a high total hydrogen concentration, specifically a total hydrogen concentration of $3 \times 10^{22}$ atoms/$cm^3$ or higher, an excellent crack resistance of the silicon nitride film is ensured.

Note that the total hydrogen concentration is adjustable by adjusting the pressure in the reactor and the supplied power such that plasma is generated stably. A silicon nitride film was formed by adjusting a proportion of the flow rate of $NH_4$ to the flow rate of $SiH_4$ within a range of 1.0 to 2.0 and adjusting the pressure and the supplied power. As a result, the silicon nitride film is obtained that has a total hydrogen concentration of $3 \times 10^{22}$ atoms/$cm^3$ or higher and a Si—H hydrogen concentration proportion of 40% or higher.

The inventor further formed silicon nitride films by capacitively-coupled plasma CVD (CCP-CVD), and compared the silicon nitride films formed by CCP-CVD with silicon nitride films formed by SWP-CVD to study a relation between the hydrogen concentration and the film density of the respective silicon nitride films formed by CCP-CVD and SWP-CVD. FIG. 7 shows measurement results of film density of silicon nitride films formed by CCP-CVD. A sample 12 in FIG. 7 and the sample 4 in FIG. 5 have substantially an equal film density. Although not shown in FIG. 5, the sample 4 was formed at a film formation temperature of 100 degrees C. Compared with this, the sample 12 was formed at a film formation temperature of 180 degrees C. This demonstrates that the sample 4, which was formed at a low temperature, has the same level of film density, that is, the same level of gas barrier properties as the film formed at a high temperature by CCP-CVD, which is a conventional film formation method. A sample 11 in FIG. 7 and the sample 3 in FIG. 5 have substantially an equal film density. Although not shown in FIG. 5, the sample 3 was formed at a film formation temperature of 100 degrees C. Compared with this, the sample 11 was formed at a film formation temperature of 300 degrees C. This demonstrates that the sample 3, which was formed at a low temperature, has the same level of film density, that is, the same level of gas barrier properties as the film formed at a high temperature.

Figure 9:
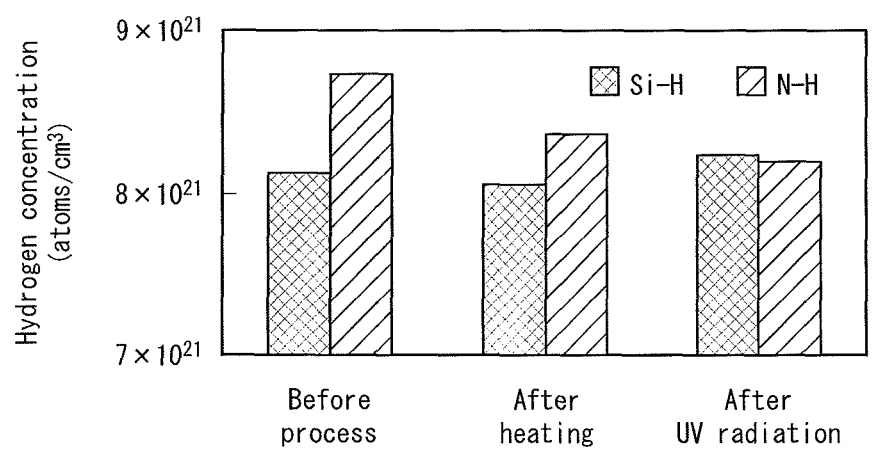
FIG. 9 shows results of the weather resistance test of the silicon nitride films.

The inventor separately performed a weather resistance test on a silicon nitride film. Specifically, the inventor studied variation in water vapor transmission rate of the silicon nitride film between before and after heat process and variation in water vapor transmission rate of the silicon nitride film between before and after ultraviolet radiation process. FIG. 8 and FIG. 9 show results of the weather resistance test. Referring to FIG. 8, it was observed that the water vapor transmission rate does not vary much between before and after the heat process, but greatly varies between before and after the ultraviolet radiation process. Also, referring to FIG. 9, it was observed that the N—H hydrogen concentration more easily varies under influence by the heat process and the ultraviolet radiation process than the Si—H hydrogen concentration varies. From the above, it is inferred that N—H is cut due to ultraviolet radiation, and the silicon nitride film deteriorates and thereby the gas barrier properties deteriorate. Therefore, the N—H hydrogen concentration proportion should desirably be decreased in order to improve the weather resistance of the silicon nitride film.

Conventionally, there has been adopted a method of increasing film density of a silicon nitride film by film formation at a high temperature in order to improve the gas barrier properties of the silicon nitride film. However, in the case where a silicon nitride film is formed on a flexible substrate, the silicon nitride film should preferably be formed at a low temperature in order to avoid deterioration of the flexible substrate. A low temperature is for example 200 degrees C. or lower, and should preferably be 120 degrees C. or lower. Also, a silicon nitride film formed at a high temperature has a large stress and thereby the flexible substrate tends to warp. This is because magnitude of the stress is influenced by difference between the film formation temperature and a room temperature. Cracks might occur in the silicon nitride film due to warping of the flexible substrate. Furthermore, since decomposition of source gas of the silicon nitride film formed at a high temperature is accelerated, hydrogen is less likely to remain in the silicon nitride film. As a result, crack resistance of the silicon nitride film is difficult to obtain.

Compared with this, the silicon nitride film relating to the present embodiment, which is formed at a low temperature, exhibits the same level of gas barrier properties as the silicon nitride film formed at a high temperature. Also, as described above, it is demonstrated that the crack resistance of the silicon nitride film is determined depending on not the Si—H hydrogen concentration proportion (the N—H hydrogen concentration proportion) but the total hydrogen concentration.

From the above, in order to form a silicon nitride film at a low temperature and further improve the gas barrier properties, the crack resistance, and the weather resistance, the N—H hydrogen concentration proportion should be set to 45% or lower, and preferably 30% or lower while the total hydrogen concentration should be set to $3 \times 10^{22}$ atoms/$cm^3$ or higher. In other words, the Si—H hydrogen concentration proportion should be set to 55% or higher, and preferably 70% or higher. Setting of the total hydrogen concentration to $3 \times 10^{22}$ atoms/$cm^3$ or higher improves the crack resistance. Setting of the N—H hydrogen concentration proportion to 45% or lower exhibits at least the same level of gas barrier properties and weather resistance as the sample 4. Setting of the N—H hydrogen concentration proportion to 30% or lower exhibits the same level of gas barrier properties and weather resistance as the sample 3 or higher.

Figure 10A:
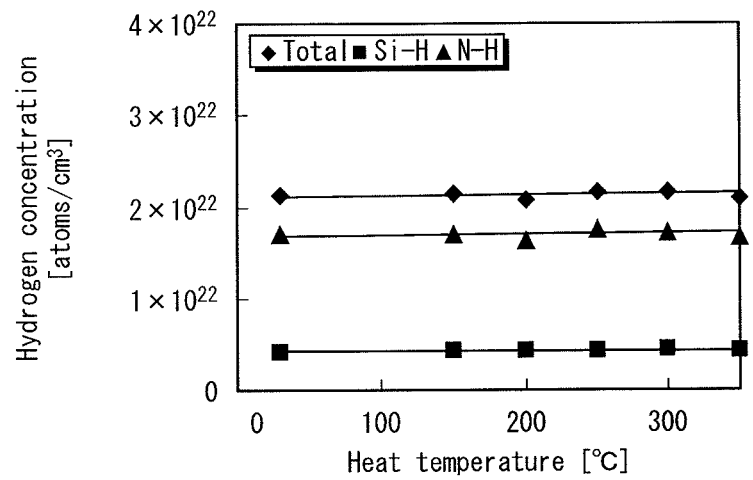
FIG. 10A to FIG. 10C show a relation between heat temperature and hydrogen concentration of a silicon nitride film, where
Figure 10B:
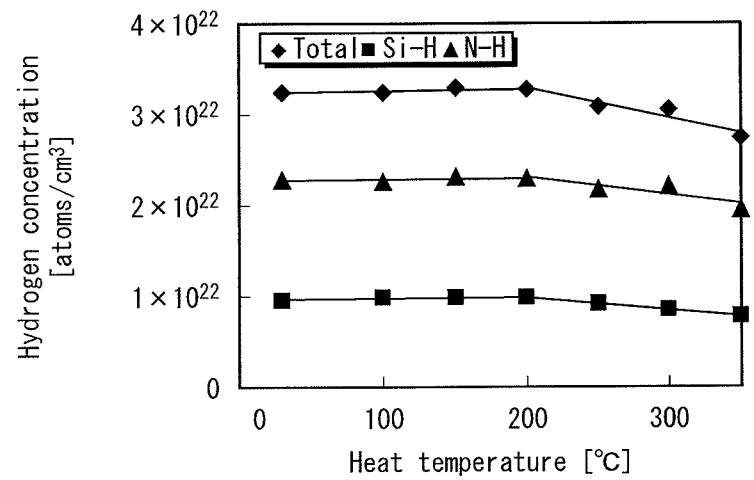
Figure 10C:
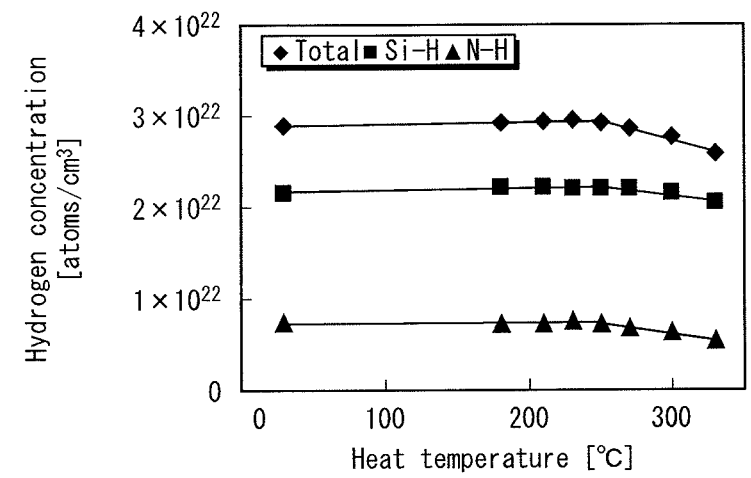

FIG. 10A to FIG. 10C show a relation between heat temperature and hydrogen concentration of a silicon nitride film. FIG. 10A shows a sample formed under conditions of a film formation method of CCP-CVD and a film formation temperature of 380 degrees C. FIG. 10B shows a sample formed under conditions of a film formation method of CCP-CVD and a film formation temperature of 180 degrees C. FIG. 10C shows a sample formed under conditions of a film formation method of SWP-CVD and a film formation temperature equal to the room temperature. In this experiment, the silicon nitride films were formed under the respective film formation conditions, the formed silicon nitride films were heated at respective temperatures for one hour, and respective hydrogen concentrations of the heated silicon nitride films were measured. Respective substrate temperatures were measured as the film formation temperatures.

In the sample, which was formed by CCP-CVD at the film formation temperature of 380 degrees C., the hydrogen concentration did not vary although the silicon nitride film was heated up to 350 degrees C. In the sample, which was formed by CCP-CVD at the film formation temperature of 180 degrees C., the hydrogen concentration varied when the silicon nitride film was heated to 200 degrees C. or higher. This demonstrates that as the film formation temperature increases, temperature at which the hydrogen concentration varies due to the heat process increases. In the sample, which was formed by SWP-CVD at the substrate temperature equal to the room temperature, the hydrogen concentration varied when the silicon nitride film was heated to 250 degrees C. or higher. Although data relating to SWP-CVD includes only data of the sample, which was formed at the substrate temperature equal to the room temperature, it is considered that when the film formation temperature exceeds the room temperature, temperature at which the hydrogen concentration varies due to the heat process also exceeds 250 degrees C. in view of the tendency of CCP-CVD. Furthermore, the sample, which was formed by SWP-CVD even at the substrate temperature equal to the room temperature, has the hydrogen concentration that varies due to the heat process at a higher temperature than the sample has, which was formed by CCP-CVD at the film formation temperature of 180 degrees C., does.

In the case where a silicon nitride film is applied to an organic EL device, it is desired to avoid deterioration of the silicon nitride film in a manufacturing process of the organic EL device. Adoption of SWP-CVD enables manufacturing of a silicon nitride with hydrogen concentration that is less likely to vary. Also, the results shown in FIG. 10A to FIG. 10C demonstrate that temperature of the silicon nitride film in a process subsequent to a formation process of the silicon nitride film should preferably not exceed 250 degrees C., and more preferably not exceed 200 degrees C.

Embodiment 2

The following explains a configuration of an electronic device that includes the barrier film relating to Embodiment 1. The electronic device relating to Embodiment 2 is an organic EL device that includes an organic EL element as an electronic element.

Figure 11:
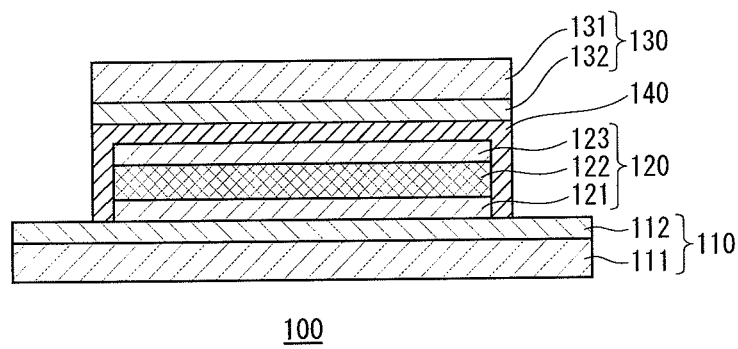
FIG. 11 is a cross-sectional view showing a configuration of an organic EL device relating to Embodiment 2 of the present disclosure.

FIG. 11 is a cross-sectional view showing the configuration of the organic EL device relating to Embodiment 2 of the present disclosure.

The organic EL device 100 includes a first flexible substrate 110, an organic EL element 120, a second flexible substrate 130, and a barrier layer 140.

The first flexible substrate 110 includes a resin substrate 111 and a barrier film 112. The resin substrate 111 is made for example from polyimide, polyethylene terephthalate (PET), polyethylene naphthalate (PEN), or cyclo-olefin polymer (COP). The barrier film 112 is the silicon nitride film explained in Embodiment 1.

The organic EL element 120 includes a first electrode 121, an organic EL layer 122, and a second electrode 123. The first electrode 121 is made for example from light-reflective conductive material such as aluminum, silver, alloy of aluminum, and alloy of silver. The organic EL layer 122 includes a light-emitting layer that is made from organic material. Also, the organic EL layer 122 may include a hole injection layer, a hole transport layer, an electron injection layer, and/or an electron transport layer as necessary. The second electrode 123 is made for example from light-transmissive conductive material such as indium tin oxide (ITO) and indium zinc oxide (IZO).

The second flexible substrate 130 includes a resin substrate 131 and a barrier film 132. The resin substrate 131 is made for example from polyimide, polyethylene terephthalate (PET), polyethylene naphthalate (PEN), or cyclo-olefin polymer (COP). The barrier film 132 is the silicon nitride film explained in Embodiment 1.

The barrier layer 140 is made for example from light-transmissive resin material such as acrylic resin and epoxy resin.

In this way, both the first flexible substrate 110 and the second flexible substrate 130 each include the silicon nitride film explained in Embodiment 1. This ensures excellent gas properties, and thereby prolongs an operating life of the organic EL device.

Figure 12:
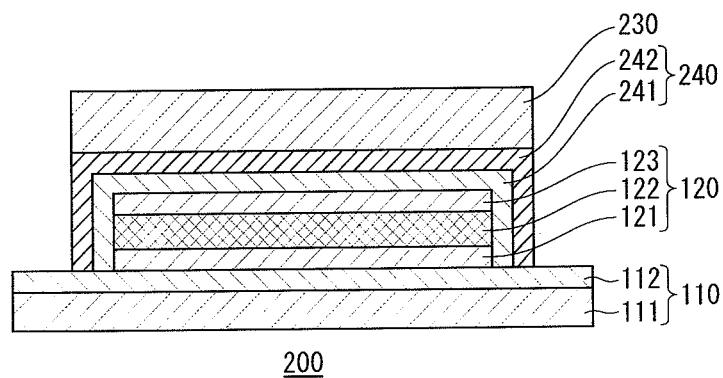
FIG. 12 is a cross-sectional view showing a configuration of an organic EL device relating to Modification 1 of Embodiment 2 of the present disclosure.
Figure 13:
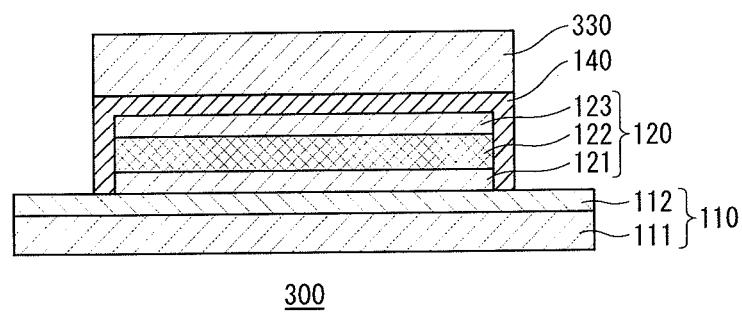
FIG. 13 is a cross-sectional view showing a configuration of an organic EL device relating to Modification 2 of Embodiment 2 of the present disclosure.

Note that, as shown in FIG. 12 and FIG. 13, only one of the first flexible substrate 110 and the second flexible substrate 130 may include the silicon nitride film. In an organic EL device 200 shown in FIG. 12, a second flexible substrate 230 is a resin substrate, and a barrier layer 240 includes a barrier film 241 and a resin layer 242. The barrier film 241 is the silicon nitride film explained in Embodiment 1. The resin layer 242 is made for example from light-transmissive resin material such as acrylic resin and epoxy resin. In an organic EL device 300 shown in FIG. 13, a second flexible substrate 330 is a resin substrate.

Figure 14:
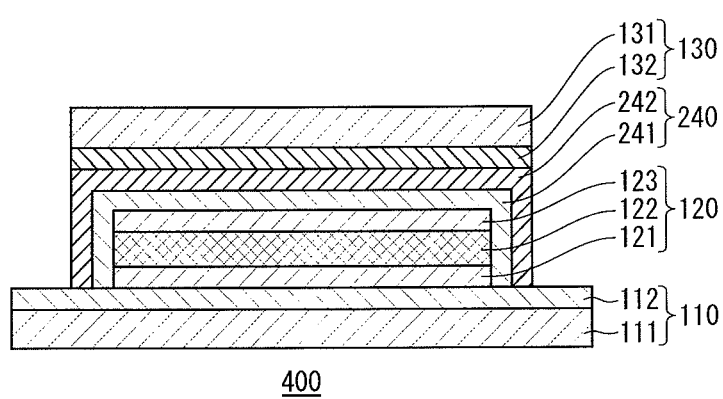
FIG. 14 is a cross-sectional view showing a configuration of an organic EL device relating to Modification 3 of Embodiment 2 of the present disclosure.

Also, like an organic EL device 400 shown in FIG. 14, a first flexible substrate 110, a second flexible substrate 130, and a barrier layer 240 may include barrier films 112, 132, and 241, respectively. In this case, at least one of the barrier films 112, 132, and 241 may be the silicon nitride film explained in Embodiment 1.

Note that the barrier films 112 and 132 may each have a higher Si—H hydrogen concentration proportion than the barrier film 241 has. The barrier films 112 and 132 are located in positions where water more easily intrudes from outside than the barrier film 241 is. It is possible to prolong the operating life of the organic EL device by improving the gas barrier properties of the barrier films which are located in positions where water easily intrudes from outside.

Also, the barrier films 112 and 132 may each have a higher total hydrogen concentration than the barrier film 241 has. When the organic EL device is warped, the barrier films 112 and 132 each have a higher bending property than the barrier film 241 has. It is possible to prolong the operating life of the organic EL device by improving the crack resistance of the barrier films which have a higher bending property when the organic EL device is warped.

Moreover, the organic EL device 400 may be of either a bottom emission type in which light emitted from the organic EL element 120 is externally extracted through the resin substrate 111 or a top emission type in which light emitted from the organic EL element 120 is externally extracted through the resin substrate 131.

In the case where the organic EL device 400 is of the bottom emission type, the barrier film 112 may have a lower N—H hydrogen concentration proportion than the barrier film 241 has, and the barrier film 241 may have a lower N—H hydrogen concentration proportion than the barrier film 132 has. In the case where the organic EL device 400 is of the bottom emission type, the barrier film 112 is located in a position where external light is incident more easily than the barrier film 241 is. Also, the barrier film 241 is located in a position where external light is incident more easily than the barrier film 132 is. It is possible to prolong the operating life of the organic EL device by improving the weather resistance of the barrier film which is located in a position where external light is easily incident.

In the case where the organic EL device 400 is of the top emission type, the barrier film 132 may have a lower N—H hydrogen concentration proportion than the barrier film 241 has, and the barrier film 241 may have a lower N—H hydrogen concentration proportion than the barrier film 112 has. In the case where the organic EL device 400 is of the top emission type, the barrier film 132 is located in a position where external light is incident more easily than the barrier film 241 is. Also, the barrier film 241 is located in a position where external light is incident more easily than the barrier film 112 is. It is possible to prolong the operating life of the organic EL device by improving the weather resistance of the barrier film which is located in a position where external light is easily incident.

Figure 15:
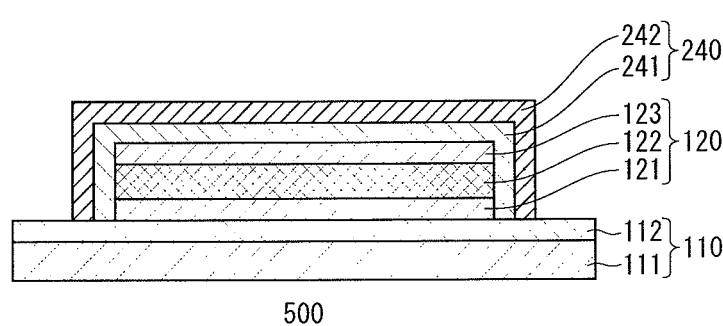
FIG. 15 is a cross-sectional view showing a configuration of an organic EL device relating to Modification 4 of Embodiment 2 of the present disclosure.

Also, like an organic EL device 500 shown in FIG. 15, a second flexible substrate 130 may not be included, and the barrier layer 240 may seal a side of an upper surface of the organic EL element 120.

Figure 16:
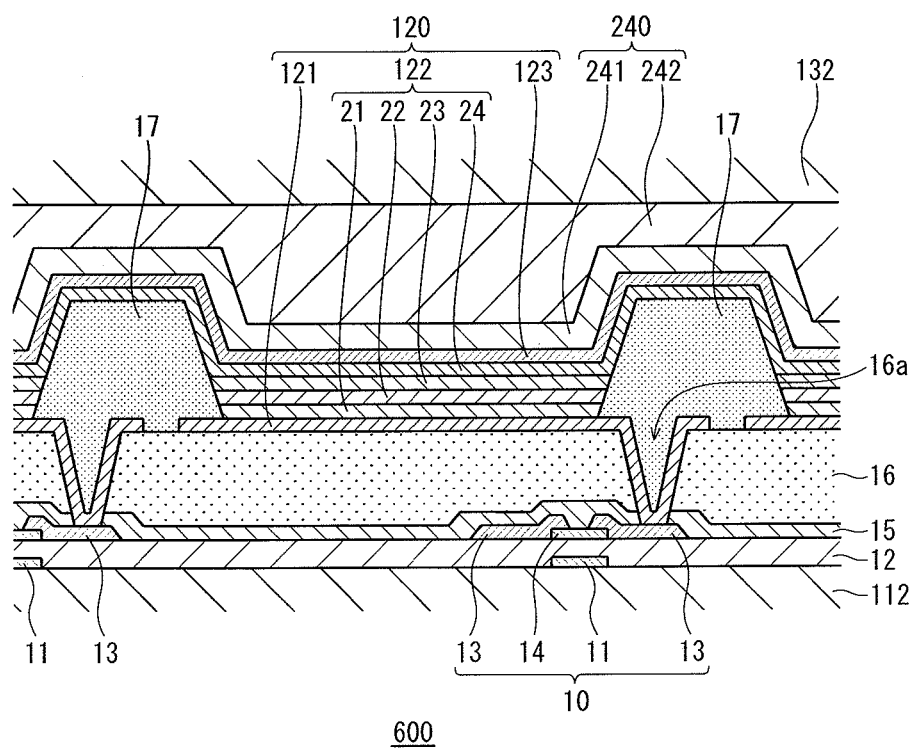
FIG. 16 is a cross-sectional view showing a configuration of an organic EL device relating to Modification 5 of Embodiment 2 of the present disclosure.

Furthermore, the organic EL element may be plural, instead of being singular. For example, an organic EL device for display includes a plurality of organic EL elements that are each constitute one sub-pixel. FIG. 16 shows an example of a configuration of an organic EL device for display. One sub pixel is shown in the figure. An organic EL device 600 includes a thin-film transistor 10 on a barrier film 112. The thin-film transistor 10 includes a gate electrode 11, a gate insulating layer 12, source drain electrodes 13, and an oxide semiconductor layer 14. The oxide semiconductor layer 14 is made for example from indium gallium zinc oxide (IGZO) and so on. The organic EL device 600 further includes a barrier film 15 that covers the thin-film transistor 10 and an interlayer insulating film 16 on the barrier film 15. The barrier film 15 and the interlayer insulating film 16 have a contact hole 16a therein. The organic EL device 600 further includes an organic EL element 120 in a region on the interlayer insulating film 16 sectioned by barrier ribs 17. The organic EL element 120 includes a first electrode 121, an organic EL layer 122, and a second electrode 123. Part of the first electrode 121 extends to the contact hole 16a to be connected to the source drain electrode 13 included in the thin-film transistor 10. The organic EL layer 122 includes a hole injection layer 21, a hole transport layer 22, an organic light-emitting layer 23, and an electron transport layer 24. The organic EL device 600 further includes a barrier layer 240 on the organic EL element 120, and a barrier film 132 on the barrier layer 240. The barrier layer 240 includes a barrier film 241 and a resin layer 242.

As described above, the organic EL device 600 includes the barrier films 112, 15, 241, and 132. These barrier films may be each the silicon nitride film explained in Embodiment 1.

Note that the barrier film 112 may have a lower total hydrogen concentration than the barrier film 132 has. Introduction of hydrogen into the oxide semiconductor layer 14 deteriorates the electrical properties of the oxide semiconductor layer 14. This causes for example a failure in threshold shift in the thin-film transistor 10. The barrier film 112 is located in a position closer to the oxide semiconductor layer 14 than the barrier film 132 is. It is possible to reduce a possibility of introduction of hydrogen into the oxide semiconductor layer 14 by decreasing the total hydrogen concentration of the barrier film which is located in a position closer to the oxide semiconductor layer 14.

Also, the barrier film 15 may have a lower total hydrogen concentration than the barrier film 132 has. The barrier film 15 is located in a position closer to the oxide semiconductor layer 14 than the barrier film 132 is. It is possible to reduce a possibility of introduction of hydrogen into the oxide semiconductor layer 14 by decreasing the total hydrogen concentration of the barrier film which is located in a position closer to the oxide semiconductor layer 14.

The following explains a method of manufacturing an organic EL device. FIG. 17A-FIG. 17D are cross-sectional views showing a manufacturing process of the organic EL device relating to the present embodiment of the present disclosure.

Figure 17A:
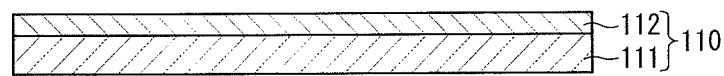
FIG. 17A-FIG. 17D are each a cross-sectional view showing a manufacturing process of the organic EL device relating to Modification 3 of Embodiment 2 of the present disclosure.

First, a first flexible substrate 110 is prepared that includes a resin substrate 111 on which a barrier film 112 is formed (FIG. 17A). The barrier film 112 may be a silicon nitride film, and may be formed by the film formation method explained in Embodiment 1.

Figure 17B:
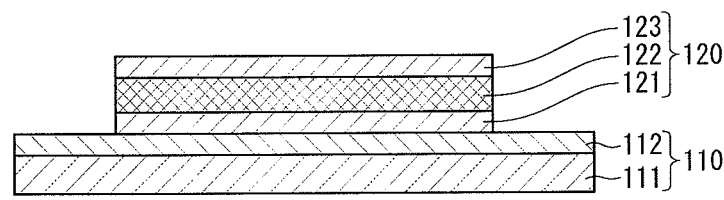

An organic EL element 120 is formed on the first flexible substrate 110 by a known method (FIG. 17B). A first electrode 121, an organic EL layer 122, and a second electrode 123, which are included in the organic EL element 120, are each formed by a vacuum deposition method, a sputtering method, an applying method, or the like.

Figure 17C:
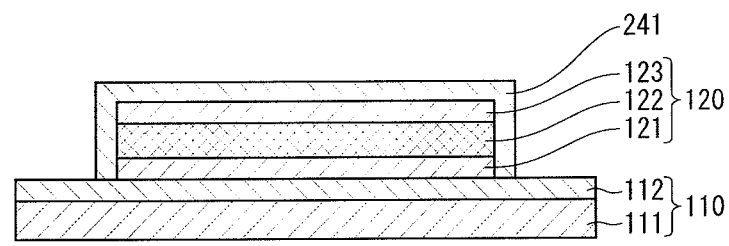

A barrier film 241 is formed on the organic EL element 120 (FIG. 17C). The barrier film 241 may be a silicon nitride film, and may be formed by the film formation method explained in Embodiment 1.

Figure 17D:
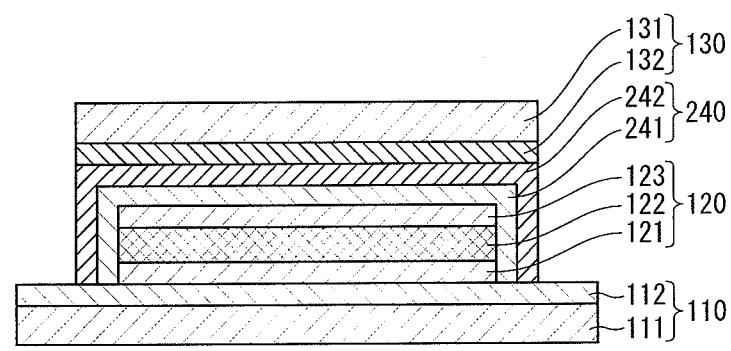

A resin layer 242 is formed on the barrier film 241, and a second flexible substrate 130 is adhered onto the resin layer 242 (FIG. 17D). A barrier film 132 included in the second flexible substrate 130 may be a silicon nitride film, and may be formed by the film formation method explained in Embodiment 1.

FIG. 18A-FIG. 18C and FIG. 19A-FIG. 19B are cross-sectional views showing a manufacturing process of the organic EL device relating to Modification 5 of the present embodiment of the present disclosure.

Figure 18A:
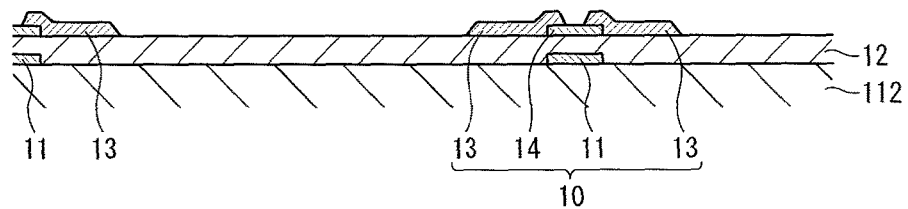
FIG. 18A-FIG. 18C are cross-sectional views showing a manufacturing process of the organic EL device relating to Modification 5 of Embodiment 2 of the present disclosure.

A thin-film transistor 10 is formed on a barrier film 112 by a known method (FIG. 18A).

Figure 18B:
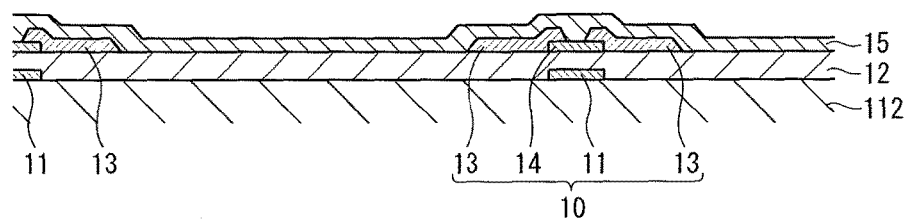

A barrier film 15 is formed on the thin-film transistor 10 (FIG. 18B). The barrier film 15 may be a silicon nitride film, and may be formed by the film formation method explained in Embodiment 1.

Figure 18C:
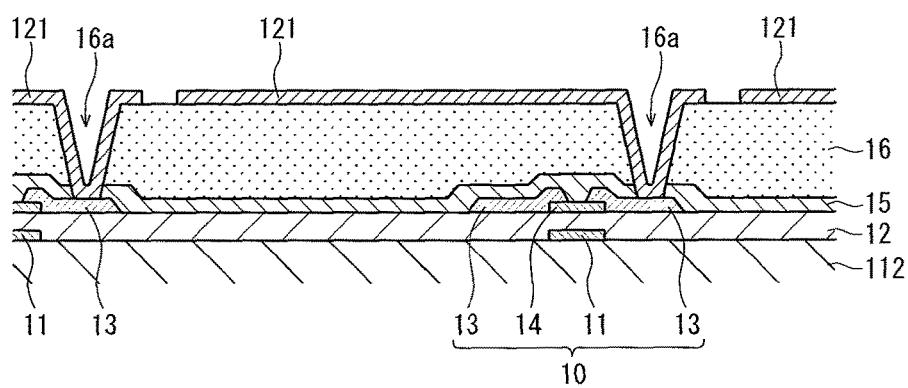

An interlayer insulating film 16 is formed on the barrier film 15 by a known method, a contact hole 16a is formed in the barrier film 15 and the interlayer insulating film 16 by a known method, and a first electrode 121 is formed on the interlayer insulating film 16 by a known method (FIG. 18C).

Figure 19A:
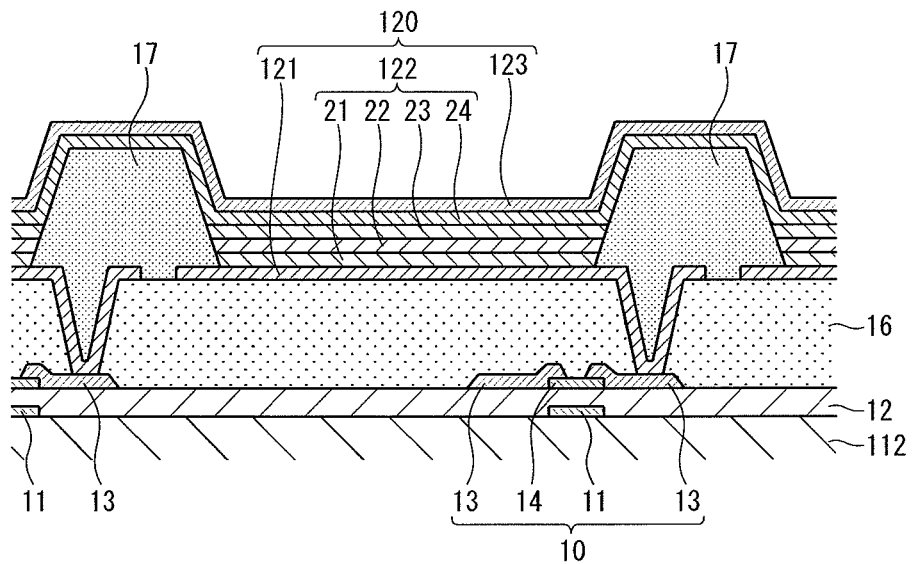
FIG. 19A-FIG. 19B are cross-sectional views showing the manufacturing process of the organic EL device relating to Modification 5 of Embodiment 2 of the present disclosure.

A barrier rib 17 is formed on the interlayer insulating film 16 by a known method, an organic EL layer 122 is formed on the first electrode 121, and a second electrode 123 is formed on the organic EL layer 122 (FIG. 19A). As a result, an organic EL element 120 completes.

Figure 19B:
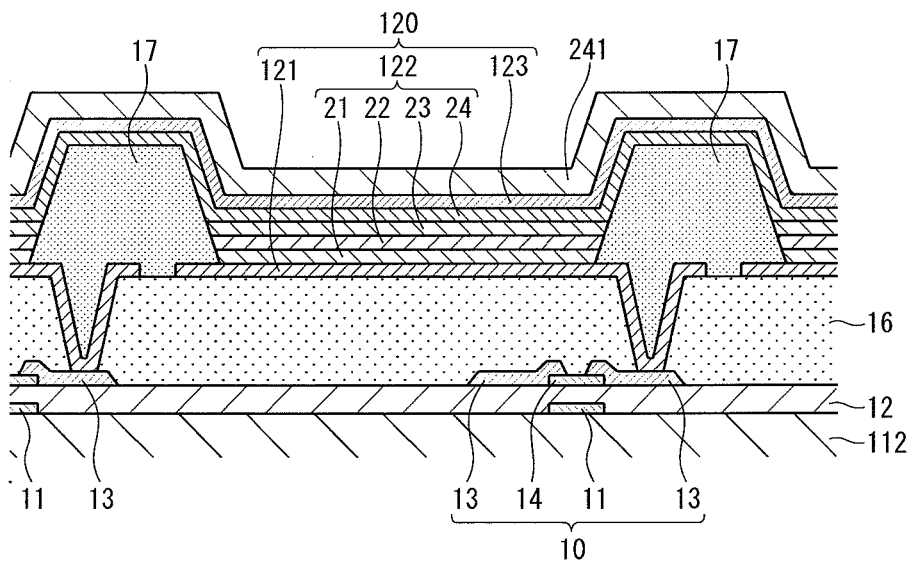

A barrier film 241 is formed on the organic EL element 120 (FIG. 19B). The barrier film 241 may be a silicon nitride film, and may be formed by the film formation method explained in Embodiment 1.

Embodiment 3

An electronic device relating to Embodiment 3 is an optical reflective device that includes an optical reflective element as an electronic element.

Figure 20:
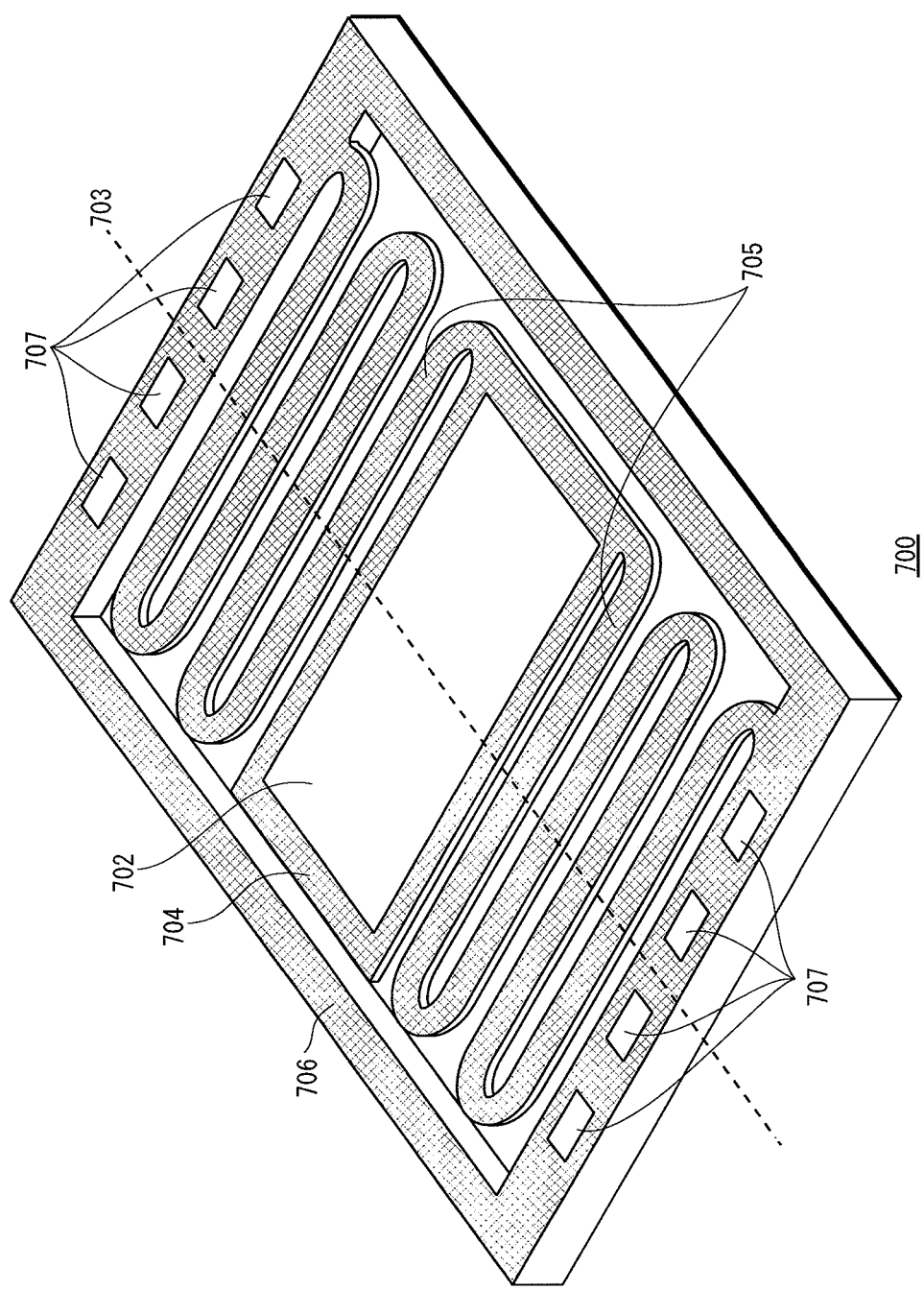
FIG. 20 is a perspective view showing an optical reflective element relating to Embodiment 3 of the present disclosure.

FIG. 20 is a perspective view showing the optical reflective element relating to Embodiment 3 of the present disclosure. An optical reflective device 700 is an example of micro electro mechanical systems (MEMS). The optical reflective device 700 includes a movable part 704 that turns about a turning axis 703, driving units 705 that are connected with the movable part 704, a frame 706 that is connected with the driving units 705, and a reflective part 702 that is provided in the movable part 704. The movable part 704, the driving units 705, the frame 706, and the reflective part 702 function as the optical reflective element.

The reflective part 702 is formed from a film that is made of light-reflective material such as metal (Ag material) provided on a surface of the movable part 704, and reflects luminous flux emitted from the movable part 704. Although not illustrated, an electrode is provided on an outer peripheral part of the movable part 704. The electrode is connected with the driving unit 705, and a driving signal for driving the driving units 705 is input to the driving units 705.

The driving units 705 each include a substrate that is made of silicon, a lower electrode that is formed on the substrate, a piezoelectric layer that is formed on the lower electrode and is made of piezoelectric material such as lead zirconate titanate (PZT), and an upper electrode that is formed on the piezoelectric layer.

The lower electrode, the piezoelectric layer, and the upper electrode are each patterned to be a desired shape by dry etching or wet etching. Then, the substrate is processed by inductively coupled plasma (ICP) dry etching. As a result, the movable part 704, the driving units 705, and the frame 706 completes.

When an electric field is applied to between the lower electrode and the upper electrode, the piezoelectric layer expands and contracts in a planar direction by an inverse piezoelectric effect. Here, a force generated in the piezoelectric layer acts as a moment in a thickness direction of the driving units 705, and as a result the driving units 705 deform. This varies inclination of the movable part 704, which is connected with the driving units 705, and the movable part 704 turns about a turning axis 703.

The silicon nitride film relating to Embodiment 1 may be formed on part of an upper surface (shaded regions in the figure) of the optical reflective element for use as a barrier layer. The silicon nitride film is formed on the entire upper surface of the optical reflective element except electrode extraction parts (pad parts) 707 that are provided on the reflective part 702 and the frame 706. In other words, the reflective part 702 and the electrode extraction parts 707 are non-formation region of the barrier layer. The non-formation region of the barrier layer is formed by forming the silicon nitride film on the upper surface of the optical reflective element and then partially removing the silicon nitride film by photolithography and etching. Note that the reflective part 702 may be formed on the silicon nitride film that is formed on the upper surfaces of the optical reflective element.

As described above, it is possible to ensure excellent gas barrier properties by using the silicon nitride film relating to Embodiment 1 as the barrier layer of the optical reflective device 700, thereby suppressing deterioration of the optical reflective element due to water.

Figure 21:
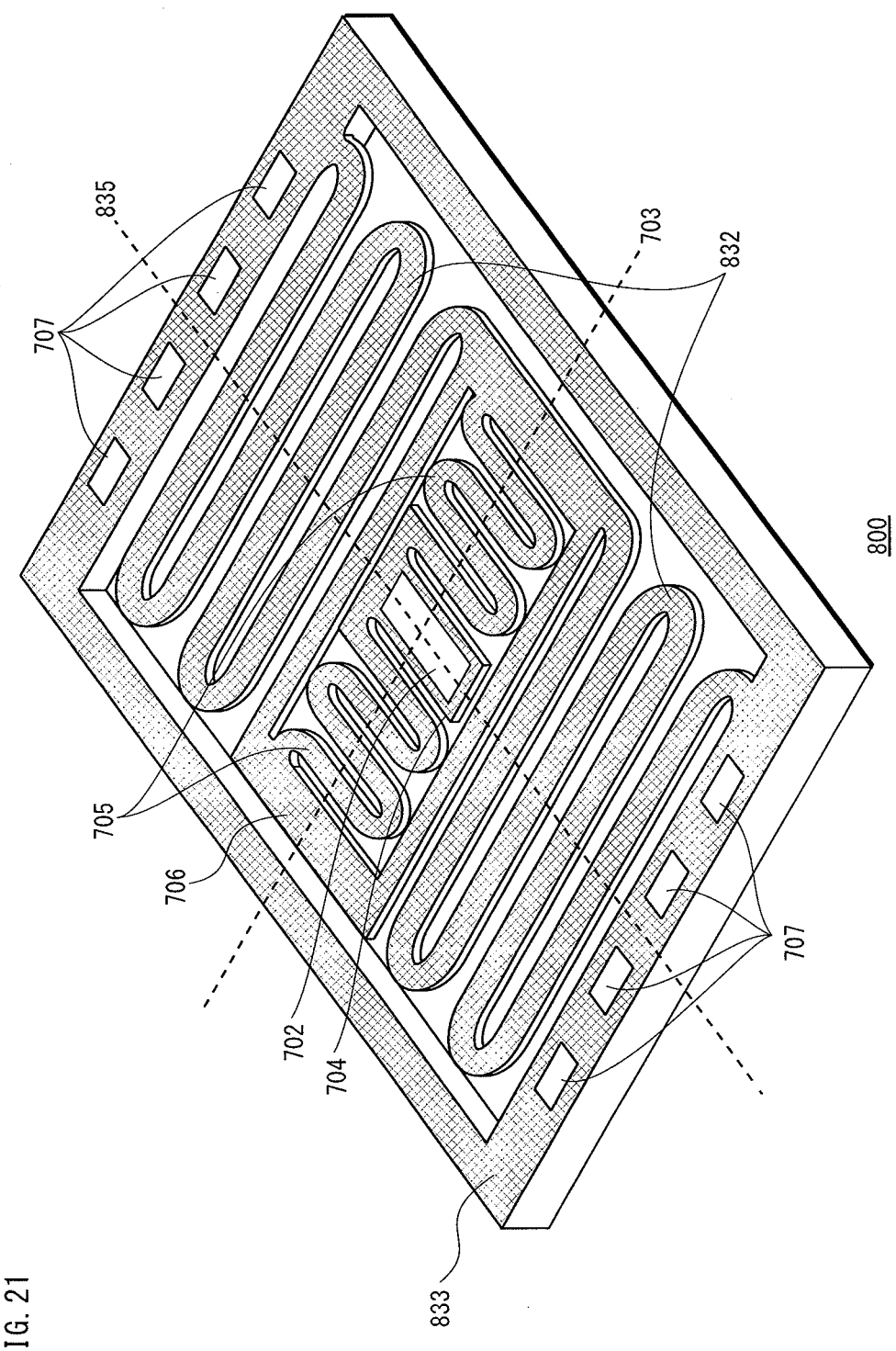
FIG. 21 is a perspective view showing an optical reflective element relating to Modification of Embodiment 3 of the present disclosure.

Like an optical reflective device 800 shown in FIG. 21, an optical reflective element may further include driving units 832 and a frame 833. The driving units 832 each have one end that is connected with an external side of a frame 706 and the other end that is connected with the frame 833. The driving units 832 are each connected with the frame 706 in a direction substantially perpendicular to the driving units 705. The driving units 832 each include, like the driving units 705, a substrate that is made of silicon, a lower electrode that is formed on the substrate, a piezoelectric layer that is formed on the lower electrode and is made of a piezoelectric material such as lead zirconate titanate (PZT), and an upper electrode formed on the piezoelectric layer. When an electric field is applied to between the lower electrode and the upper electrode of the driving unit 832, the piezoelectric layer expands and contracts, by an inverse piezoelectric effect, in a surface direction perpendicular to a thickness direction in which the lower electrode, the piezoelectric layer, and the upper electrode are layered. Here, a force generated in the piezoelectric layer acts as a moment in a thickness direction of the driving unit 832, and as a result the driving units 832 deform. This varies inclination of the movable part 706, which is connected with the driving units 832, and the movable part 706 turns about a turning axis 835.

INDUSTRIAL APPLICABILITY

The barrier film relating to the one aspect of the present disclosure is utilizable in the food, medical, and electronics fields.

REFERENCE SIGNS LIST 10 thin-film transistor
11 gate electrode
12 gate insulating layer
13 source drain electrode
14 oxide semiconductor layer
15 barrier film
16 interlayer insulating film
16a contact hole
17 barrier rib
21 hole injection layer
22 hole transport layer
23 organic light-emitting layer
24 electron transport layer
100, 200, 300, 400, 500, 600 organic EL device
110 first flexible substrate
111 resin substrate
112 barrier film
120 organic EL element
121 first electrode
122 organic EL layer
123 second electrode
130, 230, 330 second flexible substrate
131 resin substrate
132 barrier film 140, 240 barrier layer
241 barrier film
242 resin layer
700, 800 optical reflective device
702 reflective part
703 and 835 turning axis
704 movable part
705, 832 driving part
706, 833 frame
707 electrode extraction part

The invention claimed is:

1. An organic EL device comprising:
a first barrier film that contains primarily silicon nitride;
a second barrier film that contains primarily silicon nitride;
an organic EL element that is disposed between the first barrier film and the second barrier film;
a first flexible substrate that is disposed opposite the organic EL element with the first barrier film interposed therebetween;
a second flexible substrate that is disposed opposite the organic EL element with the second barrier film interposed therebetween; and
a third barrier film that is disposed between the second barrier film and the organic EL element, and contains primarily silicon nitride, wherein
a side end portion of the second barrier film and a side end portion of the third barrier film are located closer to the organic EL element than a side end portion of the first barrier film.

2. The organic EL device of claim 1, further comprising a flexible layer that is disposed between the second barrier film and the third barrier film; wherein
both the flexible layer and the third barrier film cover the organic EL element, and directly contact with the first barrier film.

3. The organic EL device of claim 1, wherein
both the first flexible substrate and the second flexible substrate made from a resin.

4. The organic EL device of claim 3, wherein
the first flexible substrate made from polyimide, polyethylene terephthalate, polyethylene naphthalate, or cyclo-olefin, and
the second flexible substrate made from polyimide, polyethylene terephthalate, polyethylene naphthalate, or cyclo-olefin.

5. The organic EL device of claim 1, wherein
at least one of the first barrier film and the second barrier film has a total hydrogen concentration of $3\times10^{22}$ atoms/cm$^3$ or higher and a silicon-bonded hydrogen concentration proportion of 55% or higher.

6. The organic EL device of claim 1, wherein
the first barrier film and the second barrier film each have a higher total hydrogen concentration than the third barrier film has.

7. The organic EL device of claim 1, wherein
the side end portion of the third barrier film is located closer to the organic EL element than the side end portion of the second barrier film.

8. An organic EL device comprising:
a first barrier film that contains primarily silicon nitride;
a second barrier film that contains primarily silicon nitride;
an organic EL element that is disposed between the first barrier film and the second barrier film;
a first flexible substrate that is disposed opposite the organic EL element with the first barrier film interposed therebetween;
a second flexible substrate that is disposed opposite the organic EL element with the second barrier film interposed therebetween;
a third barrier film that is disposed between the second barrier film and the organic EL element, directly contacts with the first barrier film at a portion of the third barrier film, and contains primarily silicon nitride; and
a resin layer that is disposed at a position distant from the organic EL element than the portion of the third barrier film, and directly contacts with both of the first barrier film and the third barrier film.

9. The organic EL device of claim 8, wherein
both the first flexible substrate and the second flexible substrate made from a resin.

10. The organic EL device of claim 9, wherein
the first flexible substrate made from polyimide, polyethylene terephthalate, polyethylene naphthalate, or cyclo-olefin, and
the second flexible substrate made from polyimide, polyethylene terephthalate, polyethylene naphthalate, or cyclo-olefin.

11. The organic EL device of claim 8, wherein
at least one of the first barrier film and the second barrier film has a total hydrogen concentration of $3\times10^{22}$ atoms/cm$^3$ or higher and a silicon-bonded hydrogen concentration proportion of 55% or higher.

12. The organic EL device of claim 8, wherein
the first barrier film and the second barrier film each have a higher total hydrogen concentration than the third barrier film has.

13. The organic EL device of claim 8, wherein
a side end portion of the second barrier film and a side end portion of the third barrier film are located closer to the organic EL element than a side end portion of the first barrier film.

14. The organic EL device of claim 13, wherein
the side end portion of the third barrier film is located closer to the organic EL element than the side end portion of the second barrier film.

* * * * *